United States Patent
Stephens

[11] Patent Number: 5,878,090
[45] Date of Patent: Mar. 2, 1999

[54] RECEIVER SYNCHRONIZATION USING PUNCTURED PREAMBLE

[75] Inventor: Donald R. Stephens, Clearwater, Fla.

[73] Assignee: E-Systems, Inc., Dallas, Tex.

[21] Appl. No.: 10,322

[22] Filed: Jan. 21, 1998

Related U.S. Application Data

[63] Continuation of Ser. No. 573,421, Dec. 15, 1995, Pat. No. 5,790,602.

[51] Int. Cl.$^6$ ....................................................... H04D 3/24
[52] U.S. Cl. ............................................. 375/326; 375/327
[58] Field of Search .................................... 375/326, 327, 375/364, 376, 365; 329/307; 370/509, 514

[56] References Cited

U.S. PATENT DOCUMENTS

| | | | |
|---|---|---|---|
| 4,419,759 | 12/1983 | Poklemba | 375/97 |
| 4,599,732 | 7/1986 | LeFever | 375/13 |
| 5,025,455 | 6/1991 | Nguyen | 375/53 |
| 5,170,415 | 12/1992 | Yoshida et al. | 375/80 |
| 5,376,894 | 12/1994 | Petranovich | 329/306 |
| 5,438,591 | 8/1995 | Oie et al. | 375/261 |
| 5,671,253 | 9/1997 | Stewart | 375/326 |

OTHER PUBLICATIONS

Phaselock Techniques, Floyd M. Gardner, Ph.D., 2nd Edition, a Wiley–Interscience Publication, John Wiley & Sons, Inc., 1979.

*Primary Examiner*—Tesfaldet Bocure
*Attorney, Agent, or Firm*—Baker & Botts, L.L.P.

[57] ABSTRACT

A receiver carrier synchronization apparatus and method for carrier synchronization with a received signal having a known data pattern preamble uses a "punctured" preamble for making carrier synchronization estimates thereby reducing the number of receivers required. The known data pattern preamble of the received signal is processed with a local reference signal and a differentiated replica of the known data pattern preamble to generate an error signal. The error signal is selectively sampled in the time domain in accordance with a puncture scheme, and the sampled error signal is used to generate the local reference signal in a closed loop. The received signal is processed with the local reference signal and a replica of the known data pattern preamble to generate a synchronization estimate signal.

8 Claims, 5 Drawing Sheets

1 1 0 1 1 0 1 1 0 1 1 0 ...
1 0 1 1 0 1 1 0 1 1 0 1 ...
0 1 1 0 1 1 0 1 1 0 1 1 ...

RECEIVER SYNCHRONIZATION USING PUNCTURED PREAMBLE

RELATED APPLICATIONS

This application is a continuation of application Ser. No. 08/573,421 filed Dec. 15, 1995 by Donald R. Stephens and entitled "Receiver Synchronization Using Punctured Preamble," now U.S. Pat. No. 5,740,602.

TECHNICAL FIELD

The present invention relates to an apparatus and method for synchronizing a communications receiver and, in particular, to an apparatus and method for carrier synchronization of a communications receiver with the received signal using a punctured preamble.

BACKGROUND OF THE INVENTION

Information is increasingly being transmitted in synchronous digital formats. In most applications, a data stream is modulated onto a carrier frequency with this modulated carrier signal transmitted over a communications channel. Most methods of modulation in use today use phase information of the carrier frequency, i.e. coherent modulation.

The key to demodulating a phase modulated signal is that a carrier with the correct frequency and phase relationship must be applied to the demodulator along with the phase modulated signal. In order to properly demodulate the modulated signal at the receiver, most receivers include both a carrier synchronizer and a clock synchronizer. Typically, phaselocked loops and the like are used in the synchronizers.

Various types of carrier synchronizer circuits are known at this time. Three types of carrier synchronizers typically used with binary phase shift keying (BPSK) modulation include the squaring loop, the Costas loop and the remodulator (sometimes referred to as the inverse or reverse modulator or unmodulator). To function properly, these synchronizers generally require a received signal having a relatively high signal-to-noise (S/N) ratio. Modified versions of these three basic types of synchronizers are used in communications systems employing other multiphase modulation formats.

A digital receiver or modem (receiving digital data over a carrier frequency) must achieve synchronization with the transmitter before the user data can be related from the transmitter to the receiver. In most communications systems, a known "data packet" (a known digital data pattern) is provided at the beginning of a data transmission to allow the receiver to achieve synchronization. This data packet is called a preamble. In some communications systems, a continuous wave (CW) carrier functions as the preamble and is transmitted to permit the receiver or modem to obtain the frequency and phase parameter estimates independent of data demodulation. This reduces the number of simultaneous variables that the receiver must solve at one time. However, in some preambles, such as the standard preamble set forth in MIL-STD-188-183, the CW sections are very short.

Since the digital data packet (preamble) in a particular communication system is known by the receiver, the receiver has a priori information about the incoming received signal and uses this information to make the necessary synchronization estimates. Preamble usage allows the receiver to synchronize to a received signal having a relatively low S/N ratio. As such, waveforms with preambles are generally used in communications systems because this allows receiver synchronization with received signals having relatively lower S/N ratios. A matched filter receiver is one type of carrier synchronizer using preamble information of a received signal to achieve synchronization.

As the preamble data is transmitted over the communications channel to the receiver, a delay or offset of the preamble occurs. This delay or offset caused by the communications channel and the receiver is called the timing ambiguity. Accordingly, the received data pattern of the preamble may be offset in time. In matched filter circuits, the timing ambiguity must be reduced to less than ½ a symbol period in order for the receiver to operate at very low S/N ratios. If the timing ambiguity is greater than ½ a symbol period, synchronization is impeded due to a large beatnote output by the phase detector in the receiver.

Depending on the length of the data pattern in the preamble before it repeats, the data pattern could appear to the receiver as one of a number of sequences. Since the timing ambiguity is random and may be uniformly distributed over the length of the repeated preamble data pattern, all of the sequences are equally likely. Accordingly, to achieve a timing ambiguity of less than ½ a symbol period and thus operate at low S/N ratios, a structure utilizing multiple matched filters is required. The required number of matched filters generally equals the number of equally likely data pattern (preamble) sequences that may be received multiplied by two. Conceptually, this results in several acquisition estimates running concurrently. At some timing instant, the estimate that has the highest correlation voltage is then chosen.

Operation of a low S/N ratio carrier synchronization circuit utilizing data preambles requires a number of additional parallel matched filter structures. The number of such structures equals the number of likely sequences of the repeated data pattern of the preamble (multiplied by two, if timing ambiguity of less than ½ is desired). Whether implemented in hardware or software, such an implementation requires additional circuitry, processing software and/or processing time.

Accordingly, there exists a need for an apparatus and method for carrier synchronization using a preamble in a receiver that operates at low S/N ratios. Further, there is needed an apparatus and method that reduces cost, complexity, software processing and/or computing power to achieve carrier synchronization. There exists a need for an improved and less costly carrier synchronization circuit and method in a communications system receiver utilizing preambles for carrier synchronization.

SUMMARY OF THE INVENTION

According to the present invention, there is provided an apparatus and method for carrier synchronization using a punctured preamble. A punctured preamble carrier synchronization receiver includes a first mixer for combining a received signal having a known data preamble pattern modulated thereon with a local reference carrier signal to generate a first mixed signal. A second mixer combines the first mixed signal with a differentiated replica of the known data preamble pattern to generate an error signal. The error signal is punctured in the time domain to generate a sampled error signal. The receiver further includes a voltage controlled oscillator for generating the local reference carrier signal in response to the sampled error signal. The first mixed signal is combined with a replica of the known data preamble pattern to generate a synchronization estimate signal for estimating carrier synchronization of the receiver.

In another embodiment, a maximum likelihood receiver system is provided for carrier synchronization of a received signal having a known data pattern preamble. The system includes a plurality of maximum likelihood receivers each generating concurrently a synchronization estimate signal. A processor receives the plurality of synchronization estimate signals and selects for carrier synchronization the maximum likelihood receiver with the highest correlated synchronization estimate signal.

The method in accordance with the present invention includes the steps of: receiving a signal having a known data pattern preamble, mixing the received signal with a local reference signal and generating an intermediate mixed signal, replicating the known data pattern preamble, differentiating the replicated known data pattern preamble, mixing the intermediate mixed signal with the differentiated replica of the known data preamble pattern and generating an error signal, selectively sampling the error signal along the time domain in accordance with a puncture scheme to generate a punctured error signal, generating the local reference signal in response to the punctured error signal, and mixing the intermediate mixed signal with the replica of the known data preamble pattern and generating a synchronization estimate signal for estimating carrier synchronization of the receiver.

DESCRIPTION OF THE DRAWINGS

For a more complete understanding of the present invention and the advantages thereof, reference is made to the following detailed description taken in conjunction with the accompanying drawings wherein.

DETAILED DESCRIPTION

Figures 1, 2:
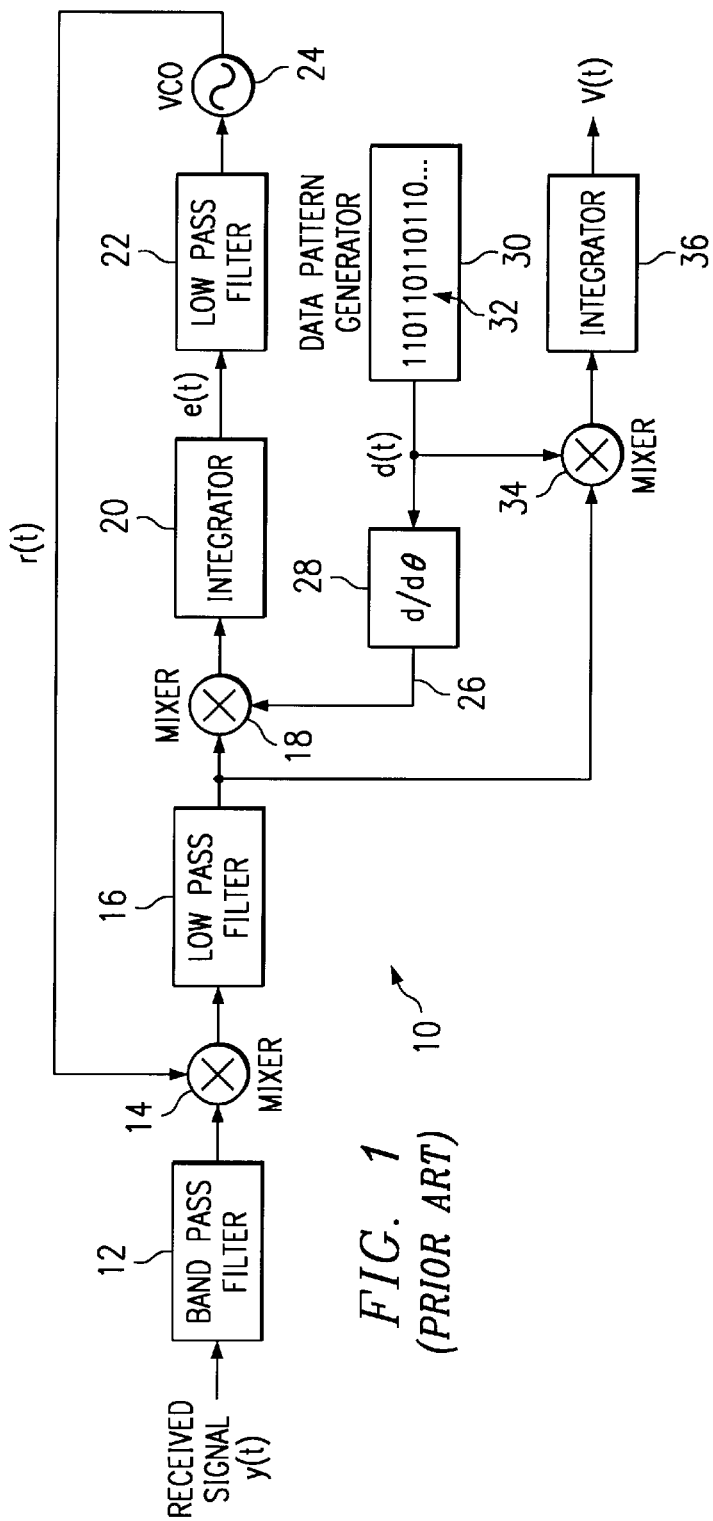
FIG. 1 illustrates a block diagram of a prior art optimum maximum likelihood receiver for carrier synchronization utilizing a known preamble data pattern.
FIG. 2 illustrates three equally likely sequences of received data patterns of a preamble pattern in accordance with MIL-STD-188-183.

With reference to the drawings, like reference characters designate like or similar parts throughout the drawings.

With reference to FIG. 1, there is shown a prior art optimum maximum likelihood receiver 10 for providing carrier synchronization of a received signal y(t). It will be understood that the received signal y(t) comprises a phase modulated carrier signal wherein the phase modulation represents the transmitted digital data carried by the carrier signal.

The fundamental requirement for a phase demodulator is to determine the transmitted information. As such, the signal received by a receiver is in the form: $y(t)=p(t)+n(t)$, where p(t) is the transmitted pulse and n(t) is additive white gaussian noise. The probability of receiving and correctly determining the transmitted signal is given by the probability of the data signal p(t) given the signal y(t). After a determination of probability density functions and orthogonal basis functions, a likelihood function for phase shift keying (PSK) modulation is represented in the form:

$$\Lambda = \int (y(t)-p(t))^2 dt + \text{Constant}$$

Accordingly, the binomial term of the likelihood function can be expanded whereby:

$$(y(t)-p(t))^2 = y(t)^2 + p(t)^2 - 2y(t)p(t)$$

In most applications using PSK modulation, the $y(t)^2$ term and the $p(t)^2$ term are constant. Therefore, to maximize the likelihood function, we must correlate the received signal y(t) with the estimated signal p(t):

$$\text{Maximize } Re[\int y(t)p(t)dt]$$

As such, the maximum likelihood receiver must be able to track and remove the unknown carrier phase and any doppler frequency offset. A necessary condition for maximizing the correlated signal is shown as:

$$\frac{d\Lambda}{d\Theta} = \frac{d}{d\Theta} Re[\int y(t)p(t)dt] = 0$$

In light of the foregoing, the maximum likelihood receiver 10 shown in FIG. 1 is, statistically speaking, an optimum receiver.

The maximum likelihood receiver 10 includes a band pass filter 12 for filtering the received signal y(t) at the center frequency fo. The filtered output is input to a first mixer 14. The other input to the first mixer 14 is a local reference signal r(t) output from a voltage controlled oscillator 24. The first mixer 14 multiplies the two signals y(t) and r(t) and outputs a signal having two components. One component is a signal having a frequency equal to the difference between the frequencies of the signal y(t) and signal r(t). The other component is a signal having a frequency equal to the sum of the frequencies of the signal y(t) and signal r(t). Both signal components also include the transmitted digital data.

The output of the first mixer 14 is input to a low pass filter 16 to remove the high frequency signal component. As such, the low pass filter 16 outputs only the signal having a frequency equal to the difference between the frequencies of the received signal y(t) and the local reference signal r(t) generated by the voltage controlled oscillator 24, with the transmitted digital data thereon. If the frequency of the signal y(t) and the local reference signal r(t) are equal, the output of the low pass filter 16 represents the data modulated on the signal y(t).

The output of the low pass filter 16 is input to a second mixer 18 and multiplied with a differentiated signal 26 output from a differentiator 28. The differentiator 28 generates the signal 26 that is the derivative, with respect to angle theta, of a replicated preamble data signal d(t) generated by a data pattern generator 30 in accordance with a known preamble data pattern 32. As will be understood, the known preamble data pattern 32 is equivalent to the data pattern of the particular preamble used in the desired communication system. Throughout the specification, the preamble specified in MIL-STD-188-183 will be used to describe the present invention. Of course, the advantages and benefits of the present invention are not limited solely to the preamble specified in MIL-STD-188-183. The present invention can be used with many different preamble patterns.

The second mixer 18 multiplies the derivative signal 26 of the preamble data signal d(t) with the output of the low pass filter 16. The second mixer 18 performs the multiplication necessary to obtain the mathematical minimum used as an error signal. The second mixer 18 is coupled to an integrator 20. The differentiator 28, the second mixer 18 and the integrator 20 are sometimes referred to as a maximum likelihood phase detector. The integrator 20 integrates over a symbol period the output of the second mixer 18. The symbol period is equivalent to the data bit period of the preamble data pattern. The integrator 20 generates an error signal e(t) that, after passing through a carrier loop filter 22, controls the voltage controlled oscillator 24.

As will be appreciated, it is a necessary condition that the received data pattern match, or substantially match, the known preamble data pattern otherwise, a substantial error signal e(t) will be generated. When the received data pattern and the known preamble data pattern does not substantially match, the error signal e(t) is generated causing a change in the phase (i.e. increasing or decreasing the frequency) of the output of the voltage controlled oscillator 24 such that the receiver phaselock loop cannot lock or synchronize with the carrier signal of the received signal y(t).

Meanwhile, as the phaselock loop is attempting to synchronize with the carrier of the received signal y(t), the output signal of the low pass filter 16 is input to a third mixer 34. The third mixer 34 multiplies the output of the low pass filter 16 with the preamble data signal d(t). In the preferred embodiment, the present invention utilizes the third mixer 34, however, an energy detector (squarer) or the like can also be used. If such a squarer is used, the output of the low pass filter 16 is squared by the squarer and the data pattern preamble signal d(t) would not used. The output of the third mixer is then integrated over time with an integrator 36 over the symbol (bit) period. The integrator 36 outputs a synchronization output signal v(t). The magnitude of the signal v(t) is related to the synchronization of the receiver with the carrier signal of the received signal y(t) and with the data pattern of the received signal y(t). As such, when v(t) exceeds some predetermined threshold value, the receiver locks or synchronizes with the carrier of the received signal. After carrier synchronization, the receiver proceeds with clock synchronization (not shown).

As described in the background section, depending on the length of the data pattern in the preamble before repetition, the data pattern could appear to the receiver as one of a number of sequences. Since the timing ambiguity is random and may be uniformly distributed over the length of the repeated preamble data pattern, all of the sequences are equally likely. The timing ambiguity must be reduced to less than ½ a symbol (bit) period in order for the receiver to operate at very low S/N ratios. Reduction of the timing ambiguity to less than ½ a symbol period produces a 6 dB gain in performance, thus allowing synchronization with received signals having reduced magnitude or power. If the timing ambiguity is equal or greater than ½ a symbol period, synchronization is impeded due to a large beatnote output by the phase detector in the receiver. Therefore, to reduce the effect of the timing ambiguity, a structure utilizing multiple maximum likelihood receivers is required.

Figure 3:
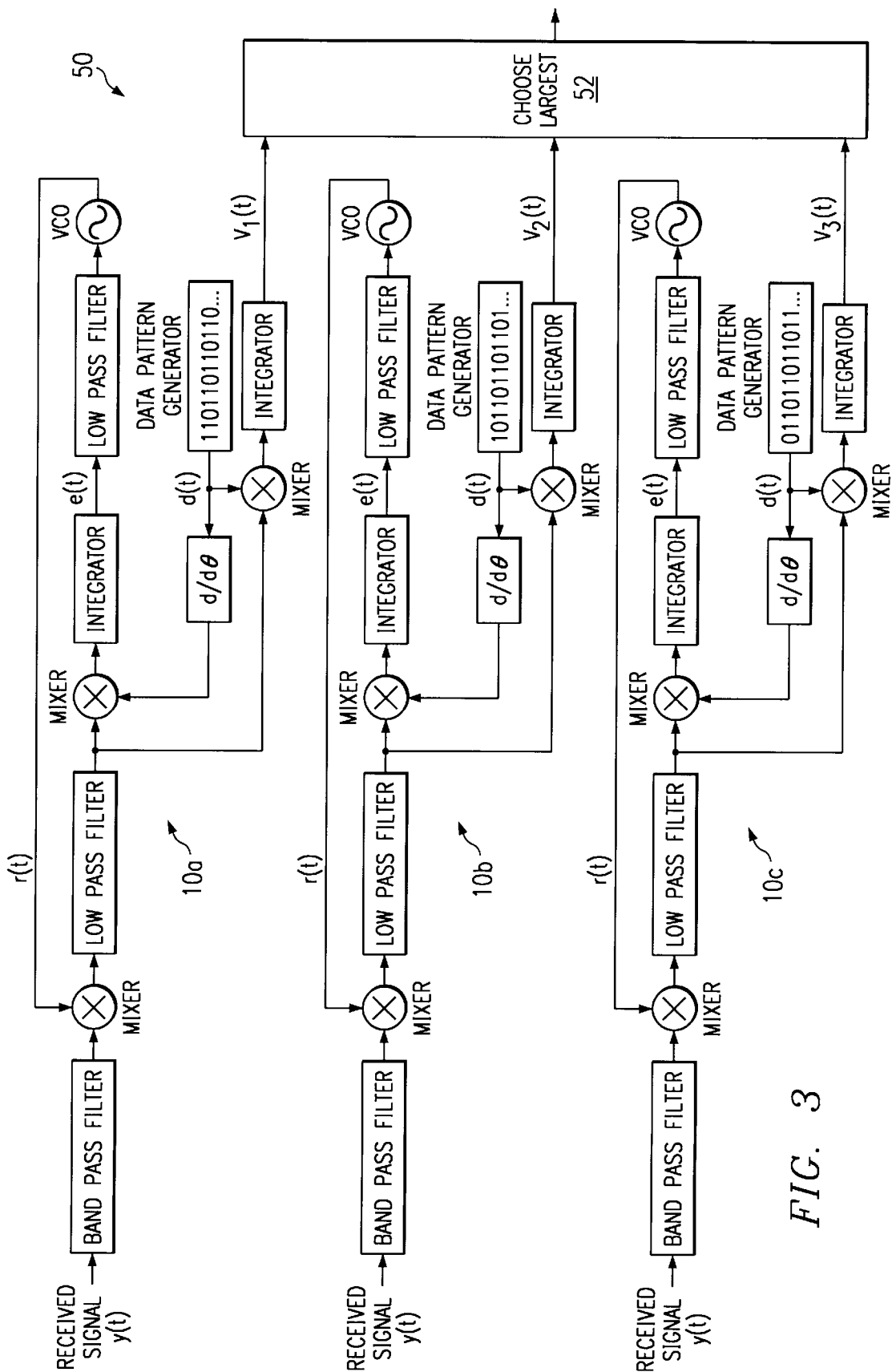
FIG. 3 illustrates a block diagram of a prior art optimum maximum likelihood receiver system using a plurality of receivers shown in FIG. 1.

Now referring to FIG. 3, there is illustrated a prior art maximum likelihood receiver system 50 including a plurality of maximum likelihood receivers 10*a*, 10*b* and 10*c*. The receiver 10*a* performs a maximum likelihood estimate with respect to one sequence of an equally likely number of sequences of the known preamble data pattern and generates an estimate output voltage $V_1(t)$. This one equally likely sequence is "110110110110 . . . ". With reference now to FIG. 2, there are illustrated three equally likely sequences of received data patterns 40*a*, 40*b* and 40*c* of the known preamble data pattern in accordance with MIL-STD-188-183. The preamble in accordance with this military standard specification consists of a "110" repeating data pattern having a predetermined length. With the given preamble pattern of MIL-STD-188-183, the timing ambiguity can be as large as three symbol periods. As such, given a random timing ambiguity distributed over the length of the repeating pattern, three equally likely data patterns may be received by a receiver. The three data patterns are shown in FIG. 2 whereby the patterns are "110110110110 . . . ", "101101101101 . . . " and "011011011011 . . . ". As such, the receiver 10*a* performs a maximum likelihood estimate with respect to the data pattern "110110110110 . . . ", the receiyer 10*b* performs the estimate with respect to the data pattern "101101101101 . . . ", and the receiver 10*c* performs the estimate with respect to the data pattern "011011011011 . . . ".

The receivers 10*a*, 10*b*, and 10*c* generate synchronization estimate output signals $V_1(t)$, $V_2(t)$ and $V_3(t)$, respectively. These synchronization estimate output signals from the receivers 10*a*, 10*b*, and 10*c* are input to a processor 52. As such, several synchronization acquisition estimates on the received signal y(t) are running concurrently. At some timing instant, the processor 52 "chooses" an appropriate signal V(t) that has the highest correlation signal, or alternatively, chooses the first signal V(t) that exceeds a threshold value. Accordingly, the receiver system 50 thereafter utilizes the appropriate corresponding receiver (10*a*, 10*b* or 10*c*) for synchronization with the received signal y(t).

It will be understood that the receiver system 50 operating with receivers 10*a*, 10*b* and 10*c* has a timing ambiguity resolution equal to ½ a symbol period. As discussed previously, it is desirable to reduce the timing ambiguity to less than ½ a symbol period. To accomplish this, the receiver system in FIG. 3 can be modified by adding three additional receivers. The additional receivers will be identical in structure to the receivers 10*a*, 10*b* and 10*c* except that a time delay equal to ½ a symbol is inserted in each preamble data pattern. This will result in a receiver system 50 having six receivers running six acquisition estimates. In such a receiver system, the timing ambiguity is equal to ¼ a symbol period. As will be appreciated, the receiver system 50 utilizing six receivers is large and costly, whether implemented with hardware or software using an embedded computer.

Figure 4:
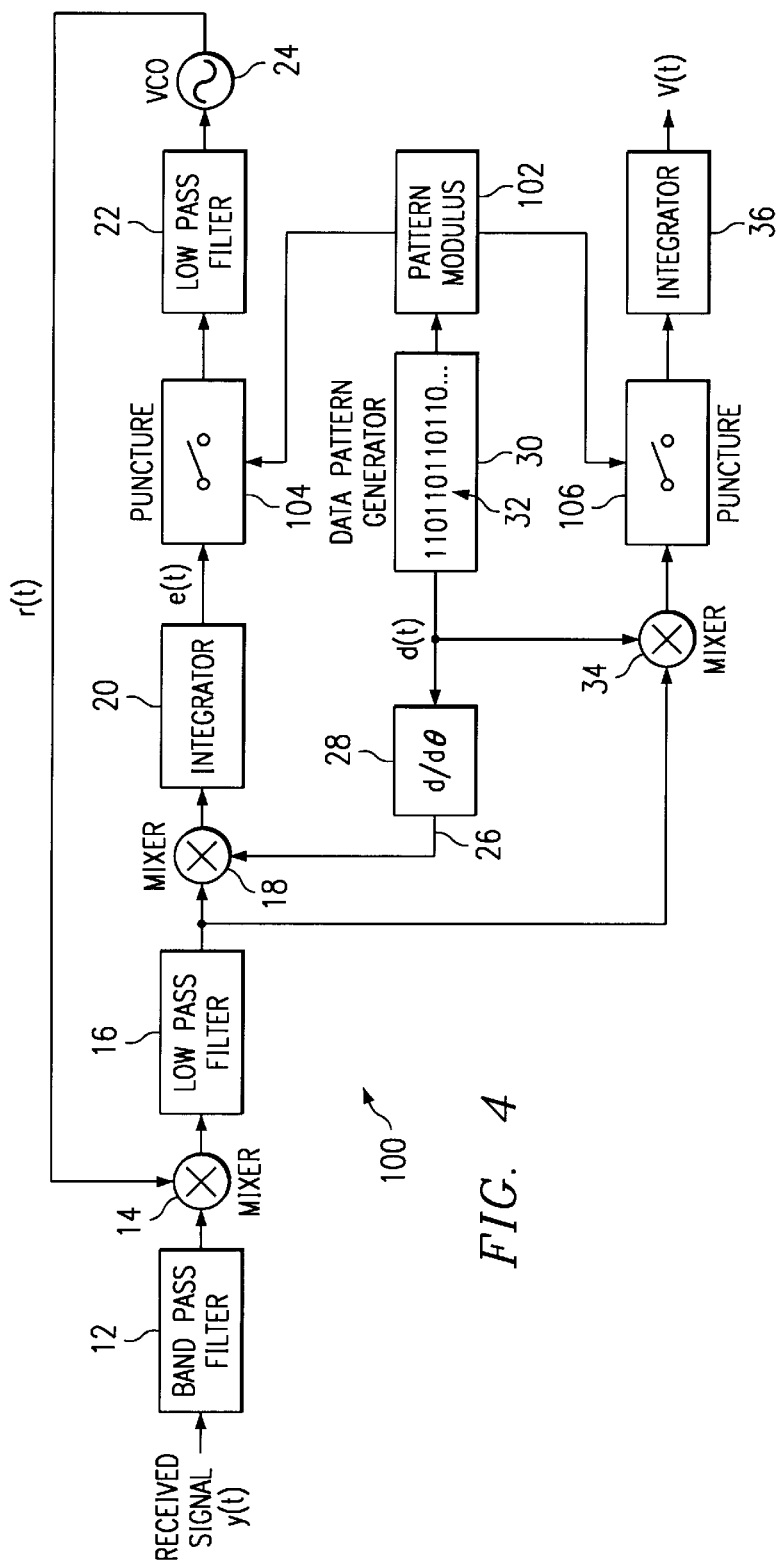
FIG. 4 is a block diagram of a punctured preamble maximum likelihood receiver in accordance with the present invention.

Now referring to FIG. 4, there is shown an optimum maximum likelihood receiver 100 (sometimes referred to as a punctured preamble acquisition receiver) in accordance with the present invention. The punctured preamble receiver 100 comprises components or structures similar to the prior art receiver 10 (shown in FIG. 1) and incorporates the present invention therein. The punctured preamble receiver 100 further includes a data pattern modulus counter 102, a puncture switch 104 and a puncture switch 106.

The word "puncture" or "puncturing", as used herein, relates to selecting one or more time domain portions corresponding to a preamble data bit stream and omitting or disregarding the one or more portions when performing the estimates for carrier synchronization. In other words, puncturing of the preamble data pattern produces selective periodic sampling of the processed received signal in accordance with punctured portion(s) of the preamble data pattern. This allows selected time domain portions of the received signal to be ignored or disregarded when the punctured preamble receiver 100 is performing or computing the acquisition estimate. This reduces the number of computations and the computational power required (if performed using software) or reduces the number of parallel structures (if performed using hardware) when performing the acquisition estimate of the punctured preamble receiver 100. In the preferred embodiment shown in FIG. 4, the error signal e(t) is selectively punctured according to the desired puncturing set forth in the modulus counter 102, with the sampled error signal e(t) subsequently input to the voltage controlled oscillator 24 to generate the local reference signal r(t).

More specifically, the data pattern generator 30 generates and outputs the preamble data signal d(t) to the data pattern modulus counter 102. The data pattern modulus pattern counter 102 determines, from the preamble data signal d(t) and those selected punctured portions, when a puncture is to be made in a received sequence and issues a command to the puncture switch 104. The modulus counter 102 is programmable in accordance with the desired puncture scheme. The puncture command is issued to activate the puncture switch 104 in response to the punctured portion(s) of the preamble data signal d(t), i.e., every third bit, every fourth bit, two out of every four bits, etc., depending on the desired puncture scheme. During a puncture, the puncture switch 104 is open thus preventing the error signal e(t) from coupling to the voltage controlled oscillator 24. This, in effect, causes the normally dynamic receiver 100 to become static during the time period of the puncture. Likewise, the modulus counter 102 issues the puncture command to the puncture switch 106.

When implemented using software, the puncture switch 104, 106 effectively act as a time delay such that the acquisition estimate calculations (loop) are stopped or static during the puncture time period. In essence, the processor and software program are simply not performing calculations or computations to generate the synchronization estimate. When implemented using hardware, the puncture switch 104, 106 have a sample and hold switch function. That is, when activated (open) the switch 104, 106 output the last previous input value before the switch 104, 106 opens. As such, the receiver 100 is still running the acquisition estimate, but is using signals output from the puncture switch 104, 106 that have constant values during switch 104, 106 activation (puncture). After the puncture time period is over, the receiver 100 performs dynamically again.

Figure 5:
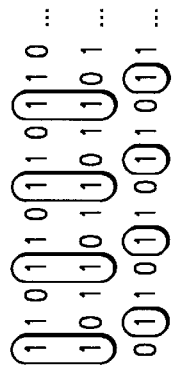
FIG. 5 illustrates punctured portions of the three equally likely sequences of received data patterns shown in FIG. 2 in accordance with the present invention.

Now referring to FIG. 5, there are illustrated "punctured" portions of the three equally likely sequences of received data patterns 40a, 40b and 40c shown in FIG. 2 in accordance with the present invention. The circled and shaded portions 42 are the "punctured" portions of the data patterns 40a, 40b and 40c. Generally, the length of the "puncture" is equal to one or more data bit periods (or symbol period) and the desired punctures depend upon the characteristics of the given preamble data pattern.

Observe that if the circled and shaded portions 42 (the "punctured" portions) of the first two data patterns 40a and 40b are disregarded, then the two data patterns 40a and 40b are inverses of each other. Recall that a carrier synchronization receiver with a phaselock loop has an inherent 180 degrees phase ambiguity. When the punctured (circled and shaded) portions of the two data patterns 40a and 40b are omitted, then a single phaselock loop will acquire either of the two patterns. The third data pattern 40c has a "puncture" made in its pattern so that it will have the same amount of signal energy as the first two data patterns 40a and 40b with "punctures". As will be appreciated, only one punctured preamble receiver 100 is required to perform the acquisition estimates for the two equally likely data preamble sequences of "110110110110 . . . " and "101101101101 . . . ".

Figure 6:
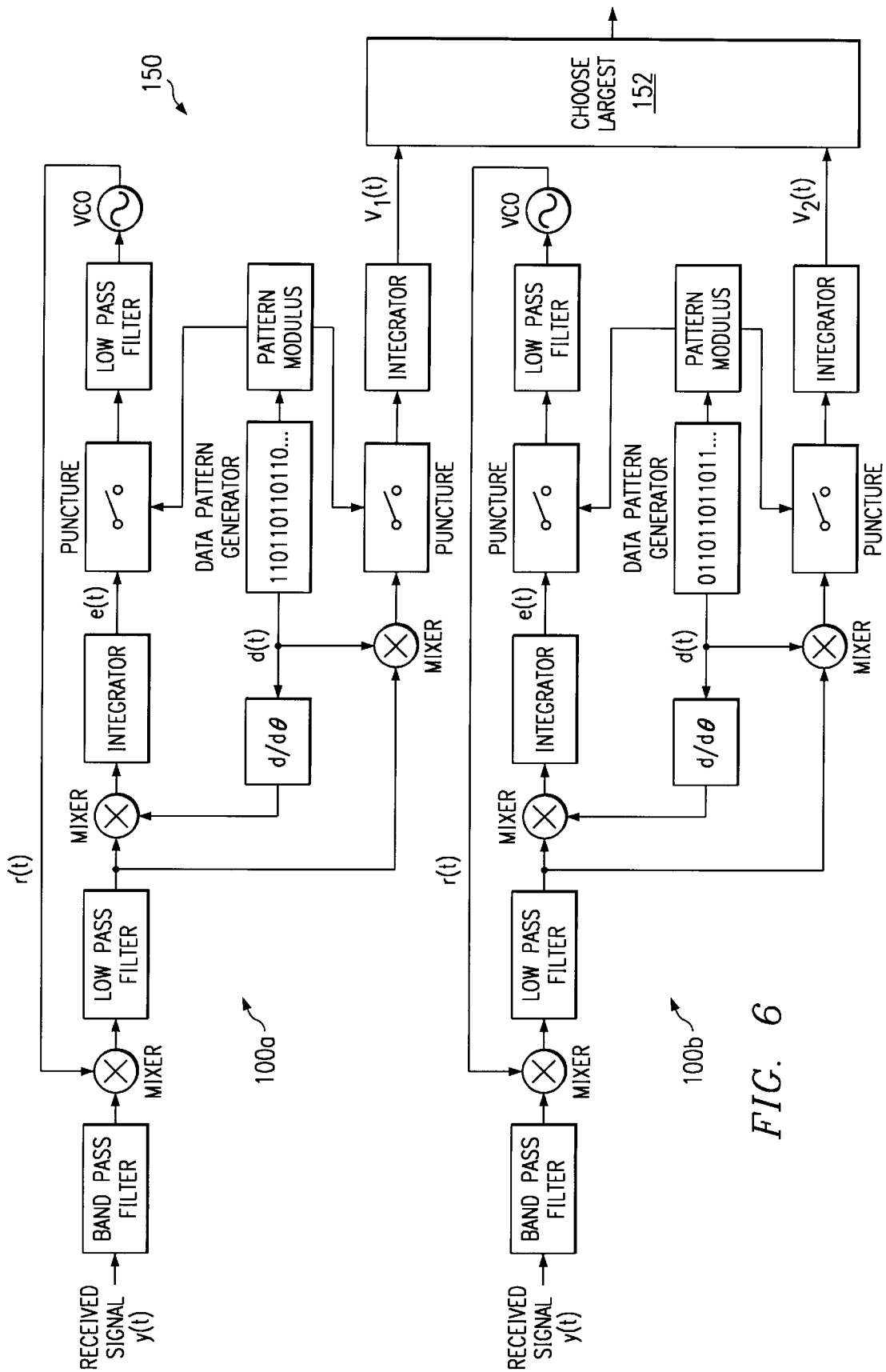
FIG. 6 is a block diagram of an apparatus for receiver synchronization using a punctured preamble in accordance with the present invention.

Now referring to FIG. 6, there is illustrated a maximum likelihood receiver system 150 including a plurality of maximum likelihood punctured preamble receivers 100a and 100b. The punctured preamble receiver 100a performs a maximum likelihood estimate with respect to the two punctured sequences of the known preamble data pattern and generates an estimate output voltage $V_1(t)$. The two punctured sequences are "110110110110 . . . " and "101101101101 . . . " (as shown in FIG. 5). As such, the pattern modulus counter 102 would issue a puncture command on the first, fourth, seventh, etc. symbol of the preamble data pattern "110110110110 . . . ". The punctured preamble receiver 100b performs the estimate with respect to the data pattern "011011011011 . . . ". The modulus counter 102 would issue a puncture command on the second, fifth, eighth, etc. symbol of the preamble data pattern "011011011 . . . ". This puncturing is not mandatory, but makes easier comparisons for processor 152.

The present invention utilizes the phase ambiguity of a single receiver to acquire two equally likely sequences. The present invention makes one or more "punctures" in the data preamble to allow one receiver to make the estimates of two receivers. This allows the same structure to acquire either of two sequences, reducing the number of total structures for receiver synchronization.

The punctured preamble receivers 100a and 100b generate synchronization estimate output signals $V_1(t)$ and $V_2(t)$ using punctured preamble data patterns. The synchronization estimate output signals from the punctured preamble receivers 100a and 100b are input to a processor 152. As such, several synchronization acquisition estimates on the received signal y(t) are running concurrently. At some timing instant, the processor 152 "chooses" an appropriate signal V(t) that has the highest correlation signal, or alternatively, chooses the first signal V(t) that exceeds a threshold value. Accordingly, the receiver system 150 thereafter utilizes the appropriate corresponding punctured preamble receiver (100a or 100b) for synchronization with the received signal y(t).

It will be understood that the receiver system 150 operating with punctured preamble receivers 100a, 100b has a timing ambiguity resolution equal to ½ a symbol period. As discussed previously, it is desirable to reduce the timing ambiguity to less than ½ a symbol period. To accomplish this, the receiver system in FIG. 6 can be modified by adding two additional punctured preamble receivers. The additional punctured preamble receivers will be identical in structure to the punctured preamble receivers 100a and 100b except that a time delay equal to ½ a symbol is inserted in each preamble data pattern generated by the data pattern generator. This will result in a receiver system 150 having four punctured preamble receivers running four acquisition estimates. In such a receiver system, the timing ambiguity is equal to ¼ a symbol period.

As will be appreciated, the receiver system 150 utilizes four punctured preamble receivers and allows the synchronization of FIG. 3 with only ⅔ of the required structures or computations. For different preambles (different from MIL-STD-188-183), different puncturing is required, according to the characteristics of the actual data pattern of the preamble. The number of punctured receivers 100 would change according to such characteristics as clock pattern and pattern length before repeating.

It will be understood from the foregoing that the present invention can be implemented in either hardware of software. If implemented in software, the present invention would include an analog-to-digital converter for converting the analog signal to digital format.

The present invention reduces the number of structures required while still maintaining the high performance synchronization estimation of prior art receivers requiring numerous parallel structures to reduce the timing ambiguity to less than ½ symbol (or bit) period. Accordingly, the present invention provides a low-cost receiver (less structure and less computations and/or computational power) while still maintaining the high performance (6 dB gain by reducing timing ambiguity to less than ½ symbol period) of a high-cost prior art carrier synchronization receiver.

Figure 7:
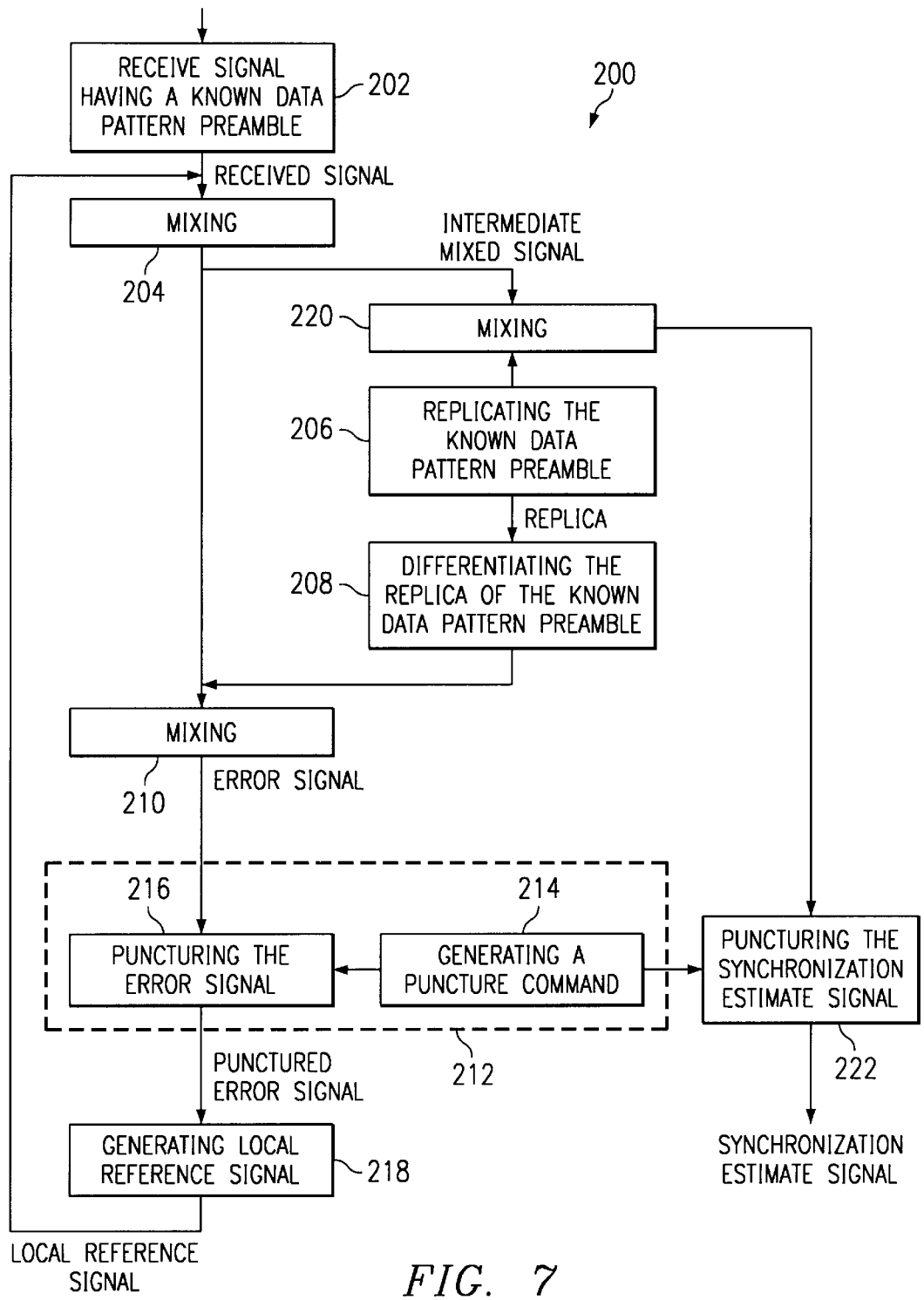
FIG. 7 illustrates the method for receiver synchronization using a punctured preamble in accordance with the present invention.

Now referring to FIG. 7, there is illustrated a method, generally described as reference numeral 200, for carrier synchronization of a received signal having a known data pattern preamble in accordance with the present invention. In a step 202, a signal is received having a known data pattern preamble. Next, in a step 204, the received signal is mixed with a local reference signal generating an intermediate mixed signal. Further, in a step 206, the known data pattern preamble of the received signal is replicated or duplicated. The replica of the known data pattern preamble is differentiated, in a step 208, to produce a differentiated replica (with respect to phase) of the known data pattern preamble. The intermediate mixed signal is mixed with the differentiated replica of the known data pattern preamble to generate an error signal in a step 210.

In a step 212, the error signal is selectively sampled along the time domain in accordance with a puncture scheme to generate a punctured error signal. In a step 214, a puncture command is generated in accordance with the puncture scheme, and in a step 216, the error signal is punctured in response to the puncture command. The punctured error signal is used to generate a local reference single in a step 218 to be mixed at the step 204 with the received signal. Additionally, the intermediate mixed signal generated by the step 204 is mixed with the replica of the known data pattern preamble in a step 220 to generate a synchronization estimate signal for estimating carrier synchronization of the receiver. In the preferred embodiment, the estimate signal generated in step 220 is further processed, in a step 222, by selectively sampling along the time domain, in accordance with the puncture scheme, to generate a punctured synchronization estimate signal.

Although the present invention has been described in the foregoing detailed description and illustrated in the accompanying drawings, it will be understood by those skilled in the art that the invention is not limited to the embodiment disclosed but is capable of numerous rearrangements, substitutions and modifications without departing from the spirit of the invention.

What is claimed is:

1. Apparatus for generating a synchronization estimate signal for carrier synchronization of a received signal having a known data pattern preamble, comprising:

a data pattern generator for generating a replica of the known data pattern preamble;

a received signal processor for combining the known data pattern preamble of the received signal with a local reference signal and with a differentiated replica of the known data pattern preamble to generate an error signal relating to the local reference signal and the known data pattern preamble of the received signal;

a puncture processor for puncturing a portion of the error signal to selectively sample the error signal according to the puncture pattern and generating a punctured signal;

a signal generator responsive to the punctured signal for generating the local reference signal; and a synchronization processor responsive to the combination of the known data pattern preamble of the received signal with the local reference signal for combining with a replica of the known data pattern preamble to generate a synchronization estimate signal relating to the synchronization of the received signal.

2. Apparatus for generating a synchronization estimate signal as set forth in claim 1, wherein said synchronization processor includes: a synchronization puncture processor for puncturing the synchronization estimate signal according to the puncture pattern and generating a punctured synchronization estimate signal.

3. Apparatus for generating a synchronization estimate as set forth in claim 2 including: a data pattern modulus counter responsive to the replica of the known data pattern preamble to generate the puncture pattern to each of the puncture processors.

4. A method for carrier synchronization of a received signal having a known data pattern preamble, comprising the steps of:

generating a differentiated replica of the known data preamble pattern of the received signal;

combining the received signal having the known data preamble pattern modulated thereon with a local reference signal and the differentiated replica of the known data pattern preamble to generate an error signal relating to the local reference signal and the known data pattern preamble of the received signal;

generating a puncture pattern signal to selectively sample the error signal;

puncturing the error signal according to the puncture pattern to generate a punctured error signal;

generating the local reference signal in response to the punctured error signal; and combining a replica of the known data pattern preamble with the combination of the known data pattern preamble of the receiving signal and the local reference signal to generate a synchronization estimate signal relating to the synchronization of the received signal.

5. The method for carrier synchronization as set forth in claim 4 further comprising the step of:

generating a replica of the known data preamble pattern; and generating a puncture pattern in response to the generated data preamble pattern.

6. The method for carrier synchronization of a received signal as set forth in claim 5 further comprising the step of:

differentiating the replica of the known data pattern preamble for combining with the known data preamble pattern and the local reference signal.

7. The method for carrier synchronization of a received signal as set forth in claim 4 further comprising the step of puncturing the synchronization estimate signal in accordance with the puncture pattern to generate a punctured synchronization estimate signal.

8. A method for carrier synchronization of a received signal as set forth in claim 5 further including the step of puncturing the synchronization estimate signal according to the generated puncture pattern to generate a punctured synchronization estimate signal.

* * * * *